United States Patent
Dai et al.

(10) Patent No.: US 7,453,629 B2
(45) Date of Patent: Nov. 18, 2008

(54) SEMICONDUCTOR OPTICAL AMPLIFIER PULSE RESHAPER

(75) Inventors: Hongxing Dai, Huntington Beach, CA (US); Peng Wang, Shanghai (CN); Jinpin Ying, East Brunswick, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/321,151

(22) Filed: Dec. 29, 2005

(65) Prior Publication Data

US 2007/0153365 A1 Jul. 5, 2007

(51) Int. Cl.
 *H01S 5/00* (2006.01)
 *H04B 10/17* (2006.01)
(52) U.S. Cl. ........................ 359/344; 398/175
(58) Field of Classification Search ............... 359/344; 398/175
 See application file for complete search history.

(56) References Cited

U.S. PATENT DOCUMENTS

| | | | | |
|---|---|---|---|---|
| 3,467,906 A | * | 9/1969 | Cornely et al. ............ | 359/344 |
| 5,754,578 A | * | 5/1998 | Jayaraman ................. | 372/50.1 |
| 6,252,896 B1 | * | 6/2001 | Tan et al. .................. | 372/50.11 |
| 6,330,265 B1 | * | 12/2001 | Kinoshita ................. | 372/50.12 |
| 6,407,855 B1 | * | 6/2002 | MacCormack et al. ...... | 359/346 |
| 6,445,495 B1 | * | 9/2002 | Walker et al. .............. | 359/344 |
| 6,577,435 B1 | * | 6/2003 | Bang et al. ................. | 359/326 |
| 6,947,206 B2 | | 9/2005 | Tsadka et al. | |

OTHER PUBLICATIONS

E. Staffan, et al., "Long Wavelength Vertical-Cavity Semiconductor Optical Amplifiers," IEEE J. of Quantum Electronics, vol. 37, No. 2, Feb. 2001, pp. 274-281.

M. T. Hill et al., "Carrier Recovery Time in Semiconductor Optical Amplifiers That Employ Holding Beams," Optics Letters, vol. 27, No. 18, Sep. 15, 2002, pp. 1625-1627.

Y. Liu et al., "Wavelength Conversion Using Nonlinear Polarization Rotation in a Single Semiconductor Optical Amplifier," IEEE Photonics Tech. Lett., vol. 15, No. 1, Jan. 2003, pp. 90-92.

* cited by examiner

*Primary Examiner*—Eric Bolda

(57) ABSTRACT

A system includes a pulse reshaper for reshaping and re-amplifying optical signals in a communications network. In one embodiment, a vertical cavity semiconductor optical amplifier (VCSOA) device, comprising dual mode reflectors optically cooperating at each of an input signal wavelength ($\lambda_s$) and an offset wavelength ($\lambda_c$) proximate the input signal wavelength ($\lambda_s$) to provide thereby non-linear amplification of input signal ($\lambda_s$).

16 Claims, 5 Drawing Sheets

SEMICONDUCTOR OPTICAL AMPLIFIER PULSE RESHAPER

FIELD OF THE INVENTION

The invention is related to the field of optical communications, and in particular, to semiconductor optical amplifier pulse reshapers.

BACKGROUND OF THE INVENTION

Regenerations of optical signals are essential aspects of optical communications. Regenerations may be accomplished by re-amplification, re-shaping and re-timing through the use of optic-electronic-optic (OEO) repeaters. However, optic-electronic-optic (OEO) regenerations are expensive and technologically complex. Currently, OEO regenerations are the main approach commercially available for this task.

SUMMARY

Various deficiencies of the prior art are addressed by the present invention devices and methods for optical signal reamplification.

In one embodiment, a semiconductor optical amplifier (SOA) device includes dual mode reflectors optically cooperating at an input signal wavelength ($\lambda_s$) and an offset wavelength ($\lambda_c$) proximate the input signal wavelength ($\lambda_s$) to provide thereby non-linear amplification of the input signal ($\lambda_s$).

An embodiment of the invention provides for a semiconductor optical amplifier (SOA) pulse reshaper, including a pump for adjusting the lasing threshold and amplification of the SOA at either signal wavelength ($\lambda_s$) or offset wavelength ($\lambda_c$) which is dependent on input digital signal intensities of logical 1 and 0. The SOA includes dual mode reflectors optically cooperating at an input signal wavelength ($\lambda_s$) and an offset wavelength ($\lambda_c$) proximate the input signal wavelength ($\lambda_s$). A controller for providing thereby non-linear amplification of input signal ($\lambda_s$).

The invention further provides other methods and system elements that implement various aspects, embodiments, and features of the invention, as described in further detail below.

The foregoing, together with other aspects of this invention, will become more apparent when referring to the following specification, claims, and accompanying drawings.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The invention will be primarily described within the context of vertical cavity semiconductor optical amplifier pulse reshaper; however, those skilled in the art and informed by the teachings herein will realize that the invention is also applicable to any apparatus and method that involves regeneration of optical signals in, for example, a communication network.

This invention may be utilized to replace the OEO regeneration approach with a SOA reshaper that can remarkably reduce both the cost and the complexity of the system. Embodiments of the invention can be easily integrated in front of optical receivers and/or behind other types of optical amplifiers, while providing small power consumption and footprint to improve system performance as well as simplicity.

Figure 1:
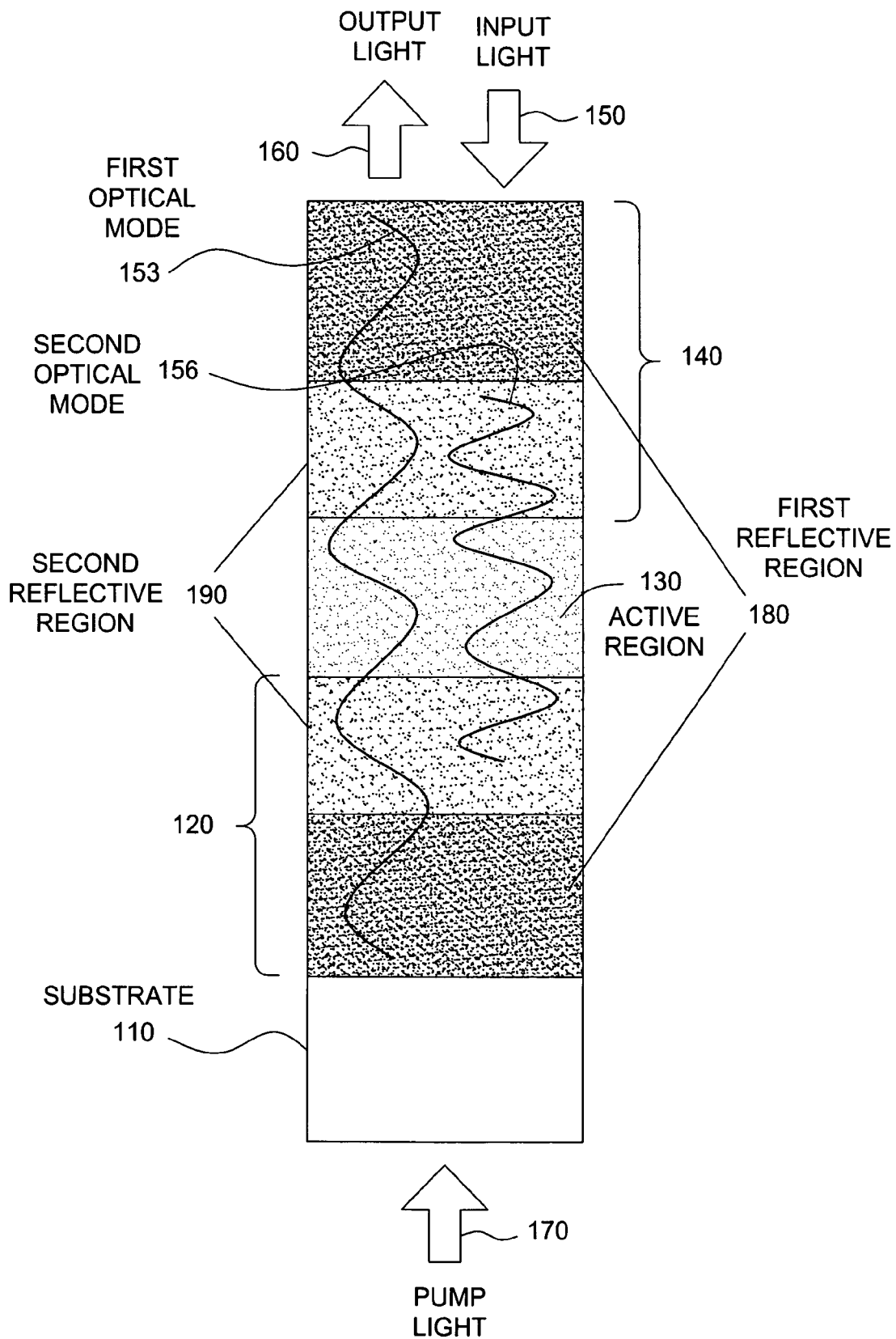
FIG. 1 depicts a block diagram of a dual mode vertical cavity semiconductor optical amplifier (VCSOA) according to an embodiment of the invention.

FIG. 1 depicts a block diagram of a dual mode vertical cavity semiconductor optical amplifier (VCSOA) 100 according to an embodiment of the invention. Specifically, the VCSOA 100 comprises four layers: a substrate layer 110, a first dual mode distributed Bragg reflector (DBR) mirror 120, an active region 130, and a second dual mode DBR mirror 140.

Portions of the structure of the VCSOA are well known in the art, except for the "dual mode" design of this invention. The bottom layer of the four layers the substrate 110. The next layer above the substrate is the first dual mode DBR 120 layer. The next layer above the first DBR layer is the active region 130. The top layer is the second dual mode DBR layer 140. The input light is transmitted into the VCSOA from the top of layer 140. The input light enters the active region 130. The active region 130 amplifies the input light by reflecting the light between the first and second DBR mirrors 120 and 140, and by pumping the region with the pump light 170. The pump light 170 transfers the pump energy into signal optical energy. The structure of the two DBRs at both ends of the active region produces wavelength-selective reflections where the light in the active region 130 is amplified. With appropriate selection of the cavity length which satisfies L=n*λ/2 (wherein L is the effective cavity length, "n" is an integer, λ is the wavelength of the specific mode), the two modes of the cavity can resonate. The amplified output light exiting the VCSOA from the top DBR layer 140 is 180 degree out of phase with respect to the part of input light that is reflected-off the surface of the top DBR layer 140. The reflected-off input light is the portion of light that is reflected off the top DBR layer 140 without entering the VCSOA. The final output of the SOA should be the interfering result of the amplified output light and the reflected-off input light.

In the present invention, DBR mirrors 120 and 140 each include two portions 180, 190. A first portion reflects a first wavelength and a second portion reflects a second wavelength. Thus, the VCSOA has 2 reflective wavelengths and two modes of operation. The space between the mirrors or cavity length is selected such that the equation L=n*λ/2 (wherein L is the effective cavity length, "n" is an integer, λ is the wavelength of the specific mode) can be satisfied for both wavelengths. The dual mode VCSOA receives an input optical signal $\lambda_s$ 150. The output optical signals 160 have wavelengths of $\lambda_S$ and $\lambda_C$. One wavelength $\lambda_S$ is the same wavelength as the input signal and the other $\lambda_C$ is separated by a small offset. The two wavelength outputs are amplitude modulated by each other and are interleaved in time domain with logic zeros and ones. The offset is selected to be small enough to obtain strong interaction between the two modes. In one embodiment, the wavelength offset is a value between ±0.4 nm and ±4.0 nm. In other embodiments, other amounts of offset are used. The offset values are varied by the selection of the reflective portions of the DBR mirrors as well as the effective cavity length for this offset mode.

Figure 2:
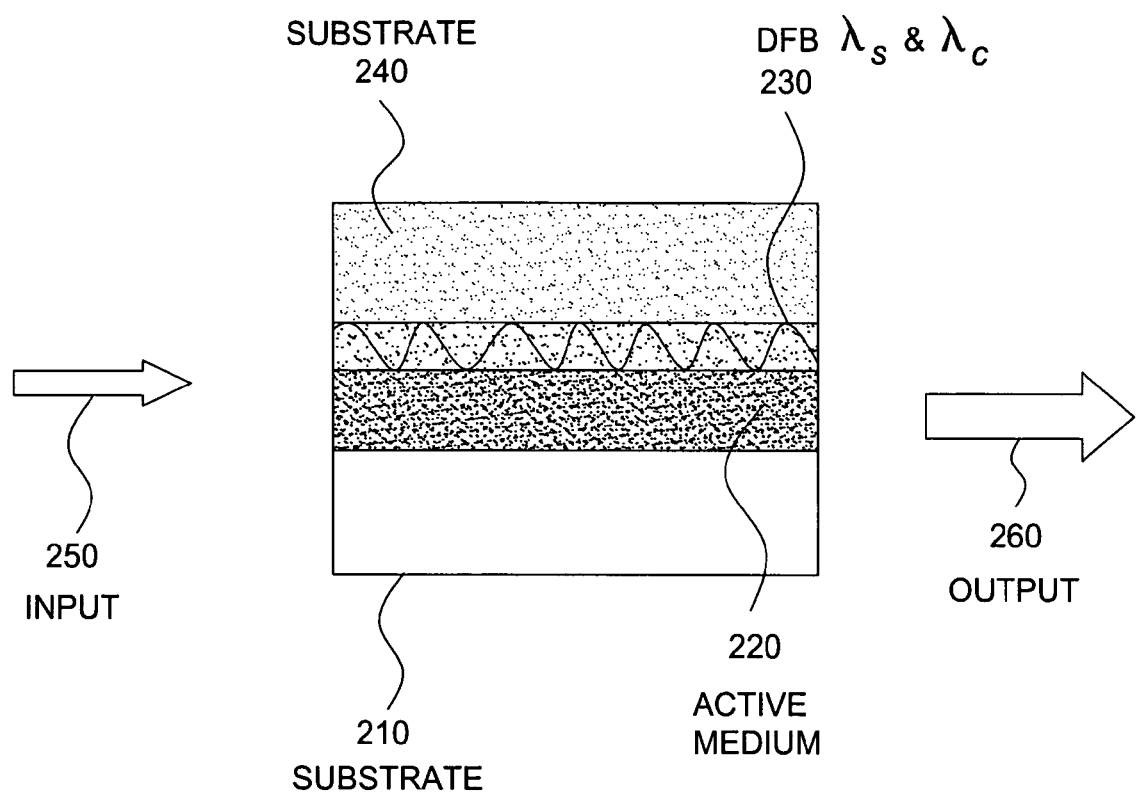
FIG. 2 depicts a block diagram of a dual mode in-plane semiconductor optical amplifier according to an embodiment of the invention.

FIG. 2 depicts a block diagram of a dual-mode in-plane semiconductor optical amplifier (SOA) according to an embodiment of the invention. Specifically, the in-plane SOA has four layers: a first substrate layer 210, an active medium layer 220, a distributed feedback (DFB) layer 230, and a second substrate layer 240.

The in-plane SOA receives as input an optical signal 250 and provides at an output an amplified optical signal 260. The bottom and top layers 210, 240 are substrate layers, which functions as the ground and contact, respectively. The DFB layer 230 includes a wavelength selective Bragg grating. The active medium 220 is in close proximity with the DFB layer. The input optical signal resonantly diffracts back and forth in the in-plane SOA. An amplified optical signal 260 exits the in-plane SOA.

In an embodiment of the present invention, the in-plane SOA has two modes that allow two wavelengths to resonate. Similar to the DBR mirrors in FIG. 1, the DFB layer of in-plan SOA has two reflective wavelengths or two modes of operation. The grating of the DFB will determine the two modes of the in-plane SOA. The dual mode in-plane SOA receives an input optical signal $\lambda_s$ 250. The output optical signals 160 will have wavelengths of $\lambda_S$ and $\lambda_c$. One wavelength $\lambda_S$ is the same wavelength as the input signal and the other $\lambda_C$ is separated by a small offset. The two wavelength outputs are amplitude modulated by each other (i.e. mutual modulation) and are interleaved in time domain with logic zeros and ones. In one preferred embodiment, the preferred wavelength offset is between ±0.4 nm and ±4.0 nm. In other embodiments, other amounts of offset are possible. The offset values are varied by the selection of the reflective portions of the DFB layer.

The two types of SOA's can both be used as pulse reshaper. The VCSOA is use in an embodiment. The VCSOA will be used to further describe the invention.

Figure 3A:
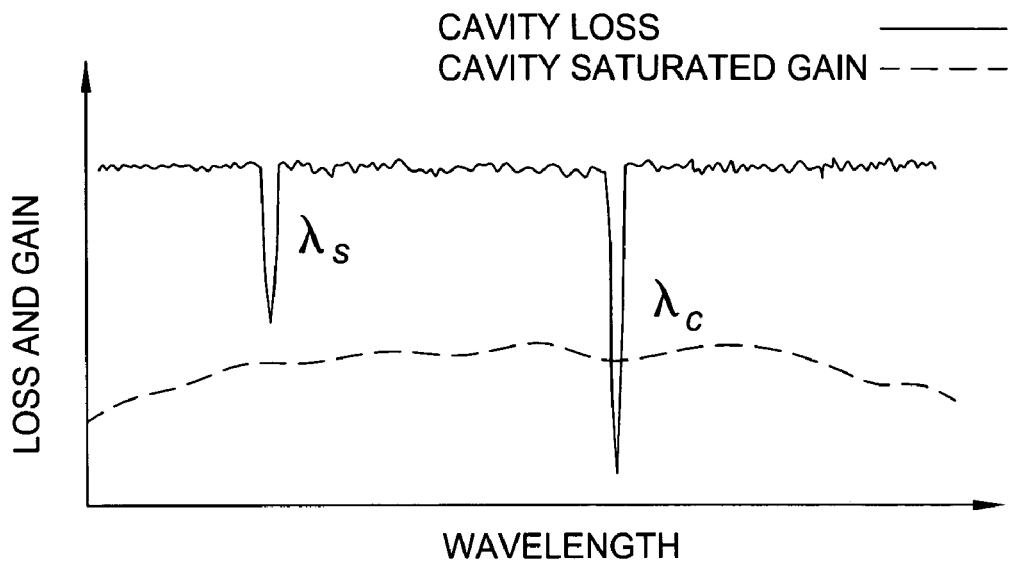
FIG. 3A depicts a line graph depicting the relationship of small signal gains and cavity losses to two modes (or two wavelengths) without input signal according to an embodiment of the invention.

FIG. 3A depicts a line graph depicting the relationship of small signal gains and cavity losses of two modes (or two wavelengths) without input signal according to an embodiment of the invention. The X-axis represents the wavelength; the Y-axis represents cavity loss and cavity small signal gain of the VCSOA. In one embodiment, the wavelength is measured in nanometer (nm); the loss and gain are measured in dB. In FIG. 3A, the solid line represents the relative cavity loss over wavelength; the dotted line represents relative cavity small signal gain over wavelength. The structure as designed will have the cavity small signal gain and cavity loss characteristics as shown by the dotted line and solid line respectively. At $\lambda_S$ there is smaller loss, represented by a dip in the curve. At $\lambda_C$ there is even smaller loss than at $\lambda_S$, represented by an even bigger dip. Lasing occurs when the cavity small signal gain is greater than the cavity loss. The dotted line is substantially a horizontal line that is below the cavity loss except at the frequencies around $\lambda_C$ with well controlled pumping level. Thus, the VCSOA lazes at $\lambda_C$ when no input signal is applied to the device.

In the preferred embodiment, when there is no input signal, the wavelength $\lambda_C$ has a greater gain than loss so it lases and clamps the VCSOA at deep saturation condition because the VCSOA is designed to have as small as possible cavity loss for this clamp mode (the clamp mode is equivalent to the offset mode in this document). The loss at wavelength $\lambda_S$ is greater than the gain at that so the SOA does not laze at $\lambda_S$. The graph of FIG. 3A depicts the condition equivalent to the optical input signal having a logical "0" as the input when there is only optical noise is injected. Full extinction of the signal output can be obtained by designing the two DBR mirrors so that the reflected-off input signal interferes with the amplified output signal thereby no light is produced from the VCSOA as output for logic "0". The cavity parameters should satisfy:

$$g_s = \frac{\sqrt{R_t}}{\sqrt{R_b}}$$

where:

$g_s$ is single pass gain;
$R_t$ is top DBR reflectivity for $\lambda_s$;
$R_b$ is bottom DBR reflectivity for $\lambda_s$.

this full extinction condition means that the optical noise contained within the logic "0" time slot is eliminated at VCSOA output.

Figure 3B:
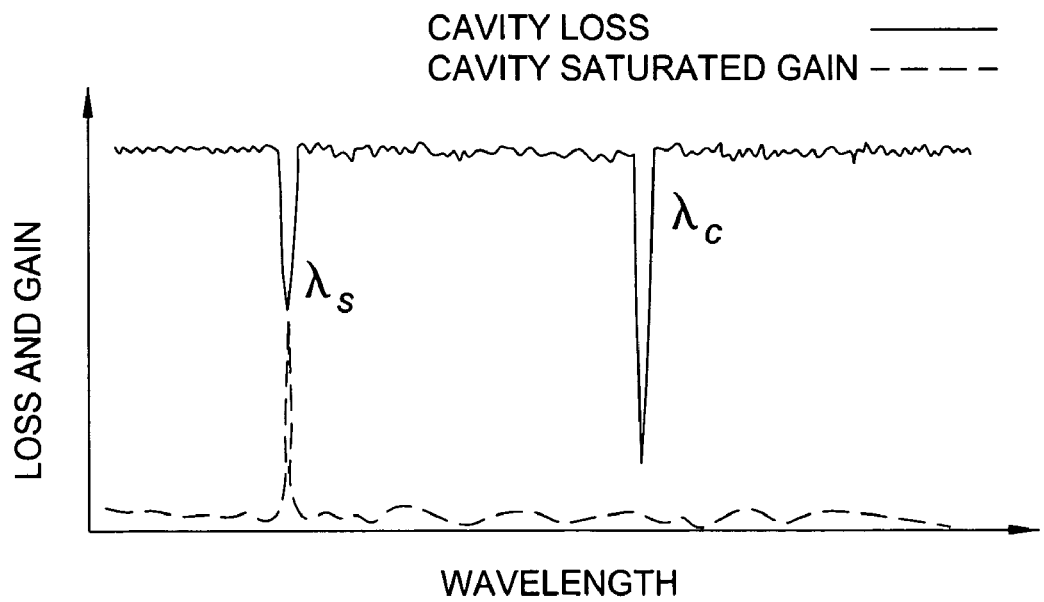
FIG. 3B depicts a line graph depicting a relationship of the gains and cavity losses to the two modes (or two wavelengths) with a logic "1" input signal with appropriate optical intensity according to an embodiment of the invention.

FIG. 3B depicts a line graph depicting a relationship of the gains and cavity losses of the two modes (or two wavelengths) with a logic "1" input signal with appropriate optical intensity according to an embodiment of the invention. In the graph of FIG. 3B, similar to the graph of FIG. 3A, the X-axis represents the wavelengths of the input signal and the Y-axis represents the cavity losses and the cavity saturated gains at the respective wavelengths. The wavelength is measured in nanometer (nm) and the gain is measured in dB. The solid line represents the cavity losses at the respective wavelengths on the X-axis, and the dotted line represent the cavity saturation gains at the respective wavelengths. When there is an input signal with optical intensity above mode competition threshold, the gain is depleted by the signal thus the signal mode overwhelms the clamp mode $\lambda_C$. As shown by the dotted line, $\lambda_S$ saturates the gain of the VCSOA. At $\lambda_C$, gain is less than the cavity loss. Thus, no lasing occurs at $\lambda_C$ in the VCSOA, and the VCSOA outputs amplified signal logic "1".

Figure 4:
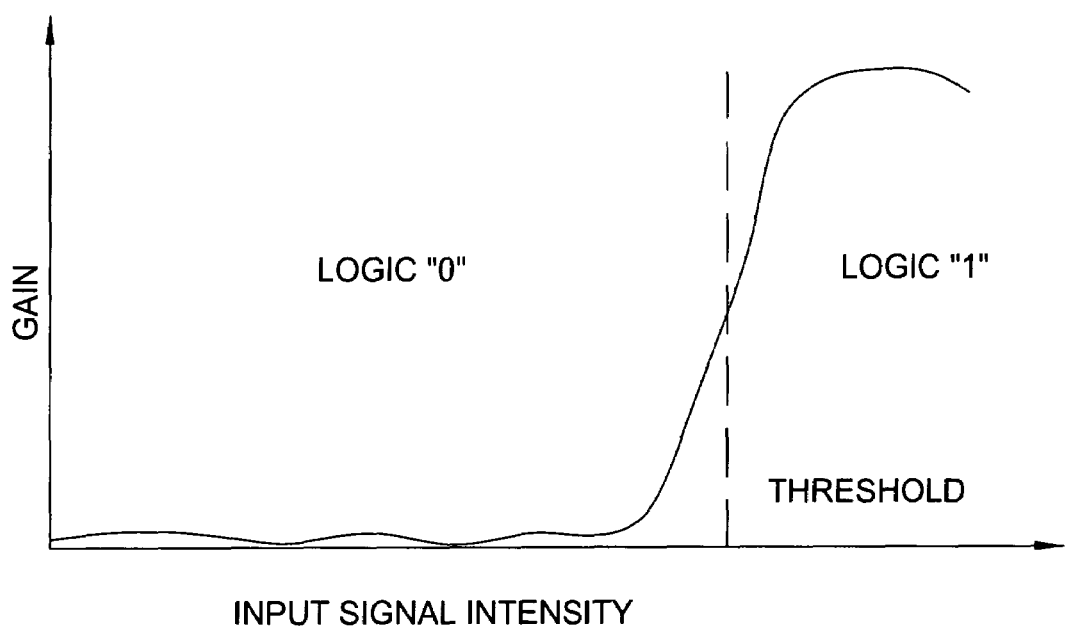
FIG. 4 depicts a line graph of signal gain as a function of input signal intensity (signal logic "0" and logic "1") according to an embodiment of the invention.

FIG. 4 depicts a line graph of signal gain as a function of input signal intensity (signal logic "0" and logic "1") according to an embodiment of the invention. The graph of FIG. 4 illustrates that the competition between the two modes results in non-linear gain profile over input signal intensity with regard to signal logic "0" and logic "1". The gain is graphed on the Y-axis, and input intensity is on the X-axis. The output gain will initially be flat and very low, which represents the logic "0." As the input signal intensity approaches the threshold, the gain jumps up into a high level, representing logic "1." After crossing the threshold, the gain flattens again representing a constant high gain, signifying logic "1." In one embodiment, the threshold is adjusted by the reflectivities of the DBRs for the two modes and the pump level. The pump intensity is optimized according to the input intensity of the signal and the geometry of the cavity and structures. Thus, the transition between the logic "0" and logic "1" will occur at the desired point, and the optical signal pulse is reshaped.

In one embodiment, the reflectivities of either the aforementioned DBR or DFB layer for the offset wavelength is higher than the input signal wavelength which results in a higher cavity loss for the signal wavelength (signal mode) than the offset wavelength (clamp mode) to implement non-linear amplification of input signal ($\lambda_S$) by means of competition between the two modes. Thus, the DBR or DFR obtains higher in-cavity optical resonating intensity for the clamp mode. The DBR or DFB clamps the gain medium layer of the SOA working in deep saturation condition and has higher response speed (higher data rate of the optical signal to be reamplified and reshaped). In one embodiment, the "smallest" loss design for the clamp mode and the high intensity input for optical signal "1" result in faster response. Thus, the design allows higher data rate input optical signal to be reamplified and reshaped by the VCSOA. The SOA device is activated by choosing a pumping level above clamp mode lasing threshold and under signal mode lasing threshold.

Figure 5:
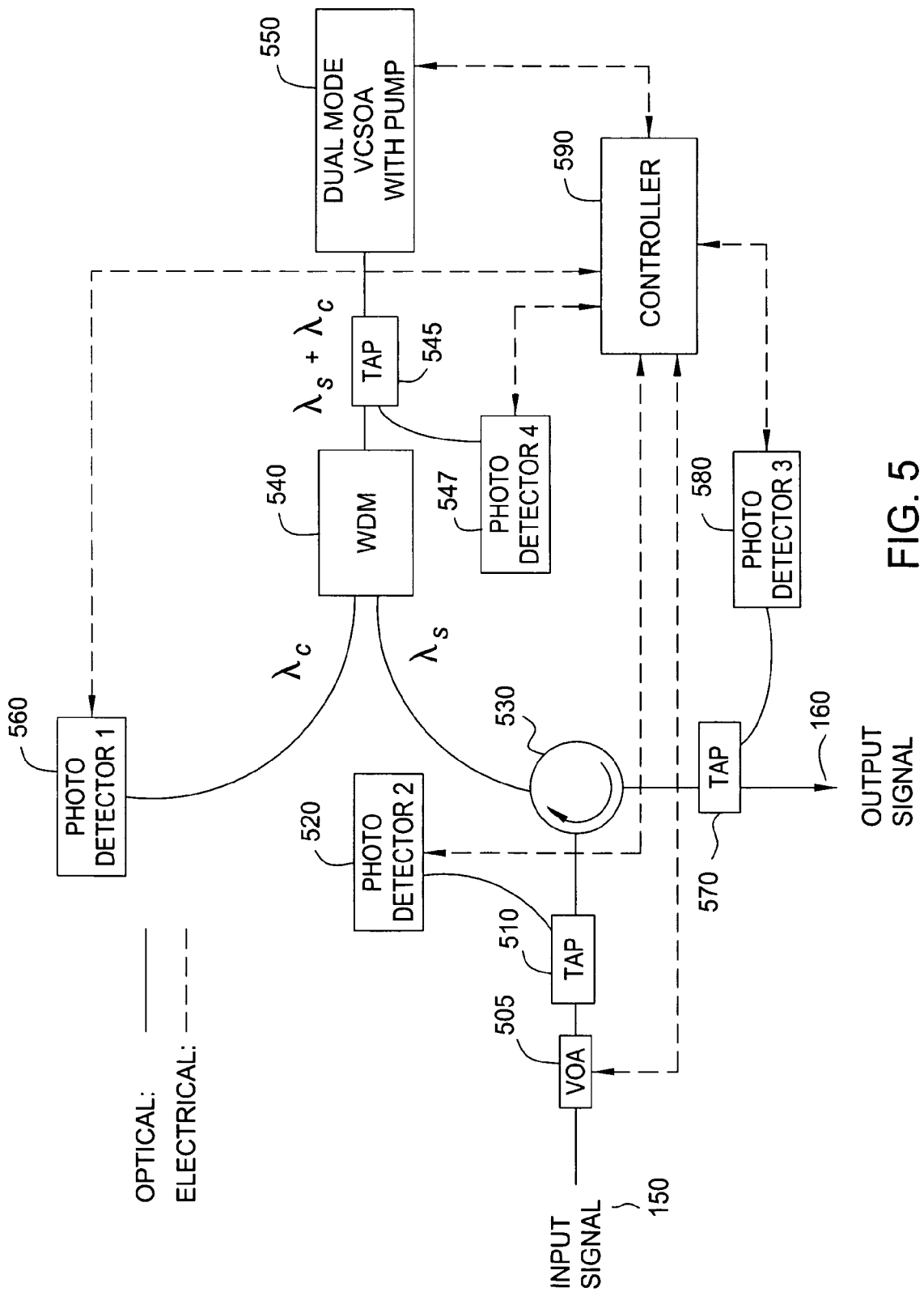
FIG. 5 depicts a block diagram of a semiconductor optical amplifier pulse reshaper according to an embodiment of the invention.

FIG. 5 depicts a block diagram of a semiconductor optical amplifier pulse reshaper 500 according to an embodiment of the invention. The embodiment of FIG. 5 depicts a module having four photodetectors 560, 520, 580, 547, three taps 510, 570, 545, a circulator 530, a wavelength division multiplexer (WDM) 540, a variable optical attenuator (VOA) 505, a dual mode VCSOA with pump 550 and a controller 590.

An optical input signal 150 enters the pulse reshaper and travels to tap 510 where photo detector 520 obtains the power level of the optical input signal and transmits the characteristic data to the controller 590. The circulator 530 circulates the input signal and passes the input signal through the WDM 540 and tap 545 into the dual mode VCSOA with pump 550. The VCSOA 550 functions as described above. The output of the VCSOA contains two wavelengths $\lambda_S$ and $\lambda_C$, which enters the tap 545 with portion of the powers of the two wavelengths directed to the photo detector 547. The photo detector 547 transmits the characteristics of the sum of the powers of the two wavelengths to the controller 590. The output of the VCSOA then continues to the WDM 540 where the two wavelengths are separated onto two different paths. The WDM 540 directs optical signal $\lambda_C$ to photo detector 560. The power level characteristics of the optical signal $\lambda_C$ are transmitted to controller 590. The WDM 540 also directs the optical signal $\lambda_S$ back to the circulator 530 where the optical signal is circulated to tap 570. The tap 570 directs a part of the signal to photodetector 580 where the output signal power level characteristics is obtained and is sent to controller 590. The controller, having the characteristics of the input signal, output signal, $\lambda_C$ signal, and the sum of the powers of the two wavelengths from output of the VCSOA, analyzes the information and respectively adjust the pump of the VCSOA 550 and the VOA 505 in order to obtain the desired output gain profile.

In one embodiment, if the fourth photodetector 547 obtains the sum of the powers of both the clamp mode output and the signal mode output as P0, and a signal is present at input port of the SOA pulse reshaper, then the input signal power is adjusted by the VOA. The adjustment to the VOA suppresses the clamp mode power level (which is obtained by photo detector 560). The adjustment to the VOA is P0/2 for non-return to zero data format and to d*P0/2 for return to zero data format, with insertion losses of the WDM and tap in the optical paths calibrated-out from the detected power levels, wherein "d" is the duty cycle of the return to zero data format.

In one embodiment, the pulse reshaper is used in telecommunication equipment because it reamplifies and reshapes the optical pulses for both NRZ (non-return to zero) and RZ (return to zero) data format.

While the foregoing is directed to various embodiments of the present invention, other and further embodiments of the invention may be devised without departing from the basic scope thereof. As such, the appropriate scope of the invention is to be determined according to the claims, which follow.

What is claimed is:

1. A vertical cavity semiconductor optical amplifier (VCSOA), comprising:
   dual mode reflectors having respective first reflective portions defining a first mode and respective second reflective portions defining a second mode, the second reflective portions being inside a region defined by the first reflective portions;
   wherein the dual mode reflectors are configured for providing an output having a first wavelength ($\lambda$s) and an offset wavelength ($\lambda$c) proximate the first wavelength ($\lambda$s), the first and second reflective portions having higher reflectivities at the offset wavelength ($\lambda$c) than at the first wavelength ($\lambda$s) for implementing non-linear amplification of an input signal at the first wavelength ($\lambda$s) by competition between the first and second modes.

2. The SOA of claim 1, wherein the SOA is an in-plane SOA using a distributed feedback (DFB) layer comprising first and second reflective regions to implement dual mode operation of the SOA.

3. The VCSOA of claim 1, wherein the dual mode reflectors are distributed Bragg reflectors (DBRs).

4. The VCSOA of claim 3, wherein one of two modes of the dual mode VCSOA clamps the gain of the VCSOA, wherein an active medium layer works in deep saturation condition.

5. The VCSOA of claim 1, wherein the input signal wavelength is greater than the offset wavelength.

6. The VCSOA of claim 5, wherein interaction between the offset wavelength and input signal wavelength within the cavity of the VCSOA results in a non-linear amplification of input signal ($\lambda$s).

7. The VCSOA of claim 1, wherein the offset wavelength is approximately within 0.4 nm of the input signal wavelength ($\lambda$s).

8. The VCSOA of claim 1, wherein if $\lambda$s has signal intensity below a threshold, then the VCSOA lases at the offset wavelength $\lambda$c.

9. The VCSOA of claim 1, wherein if $\lambda$s has signal intensity above a threshold, then the VCSOA amplifies the input signal $\lambda$s and the offset wavelength is suppressed by the signal mode at the output of the VCSOA.

10. The VCSOA of claim 1, further comprises a pump, wherein the pump has a pumping level above clamp mode lasing threshold and under signal lasing threshold.

11. The VCSOA of claim 1, wherein the offset wavelength is of a range between −0.4 nm and +4.0 nm of the input signal wavelength ($\lambda$s).

12. The VCSOA of claim 1, wherein the first reflective portions and the second reflective portions are each characterized by respective effective cavity lengths, each of the effective cavity lengths being given by an equation: $L=n\lambda/2$, where n is an integer; and the equation is satisfied for wavelength $\lambda$ at both the first wavelength ($\lambda$s) and the offset wavelength ($\lambda$c).

13. The VCSOA of claim 1, wherein the difference between the first wavelength ($\lambda$s) and the offset wavelength ($\lambda$c) is varied by adjusting at least an effective cavity length for the mode associated with the offset wavelength.

14. A method of operating a vertical cavity semiconductor optical amplifier (VCSOA), comprising:
   providing dual mode reflectors having respective first reflective portions defining a first mode and respective second reflective portions defining a second mode, the second reflective portions being inside a region defined by the first reflective portions; configuring the dual mode reflectors for providing an output having a first wavelength ($\lambda s$) and an offset wavelength ($\lambda c$) proximate the first wavelength ($\lambda s$);

wherein the first and second reflective portions have higher reflectivities at the offset wavelength ($\lambda c$) than at the first wavelength ($\lambda s$); and wherein the first reflective portions and the second reflective portions are each characterized by respective effective cavity lengths, each of the effective cavity lengths being given by an equation: $L=n\lambda/2$, where n is an integer; and the equation is satisfied for wavelength $\lambda$ at both the first wavelength ($\lambda s$) and the offset wavelength ($\lambda c$).

15. The method of claim 14, further comprising:
configuring the dual mode reflectors for competition between the first and second modes to provide a non-linear gain profile over intensity of an input signal at the first wavelength ($\lambda s$) corresponding to signal logic "0" and logic "1".

16. The method of claim 15, further comprising: adjusting an intensity threshold for transition between the signal logic "0" and logic "1" by varying the reflectivities of the first and second reflective portions for the two modes associated with the first wavelength ($\lambda s$) and the offset wavelength ($\lambda c$) and a pump level for the VCSOA.

* * * * *